(12) United States Patent
Huang et al.

(10) Patent No.: US 8,907,432 B2
(45) Date of Patent: Dec. 9, 2014

(54) ISOLATED DEVICE AND MANUFACTURING METHOD THEREOF

(75) Inventors: Tsung-Yi Huang, Hsinchu (TW); Chien-Wei Chiu, Beigang Township, Yunlin County (TW)

(73) Assignee: Richtek Technology Corporation, Chupei, Hsin-chu (TW)

(*) Notice: Subject to any disclaimer, the term of this patent is extended or adjusted under 35 U.S.C. 154(b) by 0 days.

(21) Appl. No.: 13/370,691

(22) Filed: Feb. 10, 2012

(65) Prior Publication Data
US 2013/0207185 A1 Aug. 15, 2013

(51) Int. Cl.
*H01L 29/78* (2006.01)
*H01L 29/66* (2006.01)
*H01L 29/06* (2006.01)
*H01L 29/08* (2006.01)

(52) U.S. Cl.
CPC ...... *H01L 29/66659* (2013.01); *H01L 29/0615* (2013.01); *H01L 29/0611* (2013.01); *H01L 29/0619* (2013.01); *H01L 29/66492* (2013.01); *H01L 29/0847* (2013.01)
USPC .......... 257/408; 257/409; 257/E29.007; 257/E29.012; 257/E29.014; 257/E29.268; 257/E29.269; 438/286

(58) Field of Classification Search
USPC .......... 257/344, 345, 408, E29.266, E29.268, 257/E29.269, 355, 409, 487
See application file for complete search history.

(56) References Cited

U.S. PATENT DOCUMENTS

| | | | | |
|---|---|---|---|---|
| 5,801,426 A * | 9/1998 | Okamura | | 257/386 |
| 5,918,127 A * | 6/1999 | Lee et al. | | 438/278 |
| 6,844,593 B2 * | 1/2005 | Kikuchi et al. | | 257/343 |
| 6,897,536 B2 * | 5/2005 | Nomura et al. | | 257/403 |
| 6,979,864 B2 * | 12/2005 | Negoro et al. | | 257/335 |
| 2002/0072186 A1 * | 6/2002 | Evans | | 438/306 |
| 2003/0227053 A1 * | 12/2003 | Nomura et al. | | 257/344 |
| 2010/0084711 A1 * | 4/2010 | Kim et al. | | 257/355 |
| 2010/0244148 A1 * | 9/2010 | Chaparala et al. | | 257/408 |
| 2013/0093010 A1 * | 4/2013 | Huang et al. | | 257/335 |

* cited by examiner

Primary Examiner — Julio J Maldonado
Assistant Examiner — Molly Reida
(74) Attorney, Agent, or Firm — Tung & Associates

(57) ABSTRACT

An isolated device is formed in a substrate in which is formed a high voltage device. The isolated device includes: an isolated well formed in the substrate by a lithography process and an ion implantation process used in forming the high voltage device; a gate formed on the substrate; a source and a drain, which are located in the isolated well at both sides of the gate respectively; a drift-drain region formed beneath the substrate surface, wherein the gate and the drain are separated by the drift-drain region, and the drain is in the drift-drain region; and a mitigation region, which is formed in the substrate and has a shallowest portion located at least below 90% of a depth of the drift-drain region as measured from the substrate surface, wherein the mitigation region and the drift-drain region are defined by a same lithography process.

4 Claims, 3 Drawing Sheets

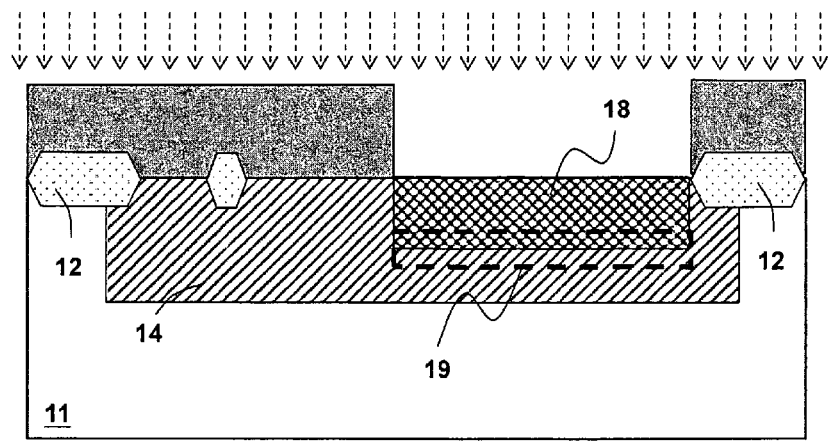
Fig. 2C
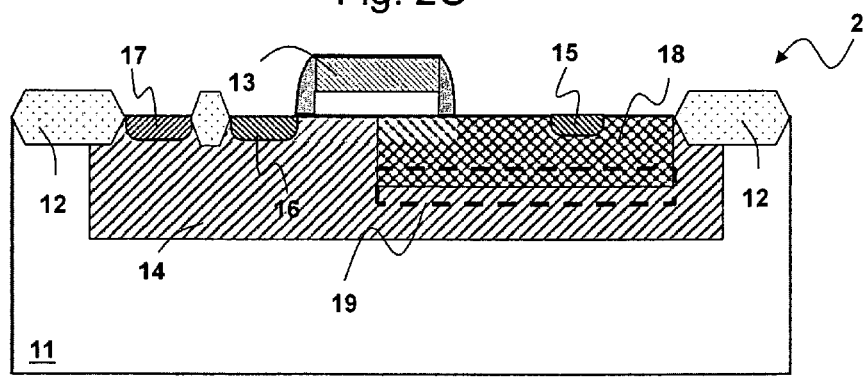
Fig. 2D
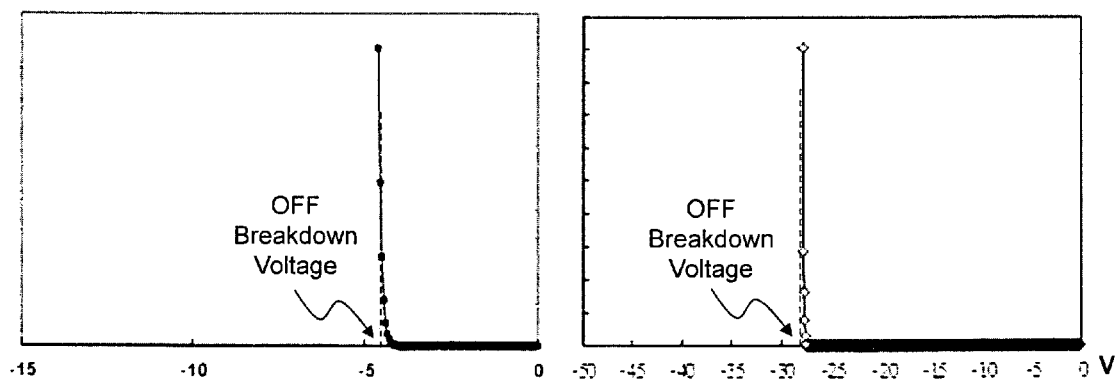
Fig. 3A (Prior Art)
Fig. 3B

ISOLATED DEVICE AND MANUFACTURING METHOD THEREOF

BACKGROUND OF THE INVENTION

1. Field of Invention

The present invention relates to an isolated device and a manufacturing method of an isolated device; particularly, it relates to such isolated device and manufacturing method wherein the breakdown voltage of the isolated device is increased by suppressing the tunneling effect.

2. Description of Related Art

FIG. 1 shows a cross-section view of a prior art isolated P-type metal oxide semiconductor (PMOS) device 1. As shown in the figure, the isolated PMOS device 1 is formed in a P-type substrate 11, which includes field oxide regions 12. The isolated PMOS device 1 includes a gate 13, an N-type well 14, a P-type drain 15, a P-type source 16, a well contact 17, and a P-type drift-drain region 18. The P-type drain 15, the source 16, and the drift-drain region 18 are formed by a lithography process and an ion implantation process, wherein the lithography process defines the implantation regions by a photoresist mask together with a self-alignment effect provided by all or part of the gate 13, and the ion implantation process implants P-type impurities to the defined regions in the form of accelerated ions. The N-type well 14 and the well contact 17 are respectively formed by lithography processes and ion implantation processes, wherein the ion implantation processes implant N-type impurities to the defined regions in the form of accelerated ions.

If the isolated PMOS device 1 as shown in FIG. 1 is required to be integrated with a high voltage device in one substrate, the high voltage device and the isolated PMOS device 1 should adopt the same manufacturing process steps with the same ion implantation parameters, and thus the flexibility of the ion implantation parameters for the isolated PMOS device 1 is limited; as a result, the isolated PMOS device 1 will have a lower breakdown voltage and therefore a limited application range. Besides, as shown in FIG. 1, the isolated PMOS device 1 includes the N-type well 14 between the P-type substrate 11 and the P-type drift-drain region 18 and thus the tunneling effect between the substrate 11 and the drift-drain region 18 further reduces the breakdown voltage. To mitigate the tunneling effect of the isolated PMOS device 1, one possible solution is to increase the N-type impurity density of the N-type well 14, but this will decrease the breakdown voltage of the high voltage device. To mitigate the tunneling effect without sacrificing the breakdown voltage of the high voltage device, additional manufacturing process steps are required, that is, an additional lithography process and an additional ion implantation process is required in order to provide different ion implantation parameters, or else the area of the high voltage device should be increased, but either way increases the cost.

In view of above, to overcome the drawback in the prior art, the present invention proposes an isolated device and a manufacturing method thereof which provide a higher breakdown voltage so that the protected device may have a broader application range, in which additional manufacturing process steps are not required and the device area is not increased, such that the protected device can be integrated with a high voltage device and manufactured by common manufacturing process steps.

SUMMARY OF THE INVENTION

A first objective of the present invention is to provide an isolated device.

A second objective of the present invention is to provide a manufacturing method of an isolated device.

To achieve the objectives mentioned above, from one perspective, the present invention provides an isolated device, including: a substrate of a first conductive type or a substrate including a first conductive type well, the substrate having an upper surface; a second conductive type isolated well formed below the upper surface, in the first conductive type substrate or in first conductive type well; a gate formed on the upper surface, and in the isolated well from top view; a first conductive type source and a first conductive type drain, which are formed in the isolated well below the upper surface, and are located at both sides of the gate respectively and separated by the gate; a first conductive type drift-drain region formed in the isolated well, the drift-drain region separating the gate and the drain, and part of the drift-drain region being beneath the gate, wherein the drain is located in the drift-drain region; and a second conductive type mitigation region formed in the substrate, wherein the mitigation region and the drift-drain region are defined by a same lithography process, and wherein the mitigation region has a shallowest portion located at least below 90% of a depth of the drift-drain region as measured from the upper surface of the substrate.

From another perspective, the present invention provides a manufacturing method of an isolated device, including: forming a second conductive type isolated well in a first conductive type region of a substrate, the substrate having an upper surface; forming a gate on the upper surface, the gate being in the isolated well from top view; forming a first conductive type source and a first conductive type drain in the isolated well below the upper surface, the source and the drain being located at both sides of the gate respectively and separated by the gate; forming a first conductive type drift-drain region in the isolated well, the drift-drain region separating the gate and the drain, and part of the drift-drain region being beneath the gate, wherein the drain is located in the drift-drain region; and forming a second conductive type mitigation region in the substrate, wherein the mitigation region and the drift-drain region are defined by a same first lithography process, and wherein the mitigation region has a shallowest portion located at least below 90% of a depth of the drift-drain region as measured from the upper surface of the substrate.

In one preferable embodiment, a high voltage device is formed in the substrate, and the isolated well is formed by a second lithography process and an ion implantation process which are used in forming the high voltage device.

In the aforementioned embodiment, the isolated device preferably further includes a second conductive type deep well, which is formed below the isolated well.

In another embodiment, preferably, the mitigation region and the drift-drain region have an overlapped region which has the first conductive type with a lower impurity density compared with the drift-drain region.

The objectives, technical details, features, and effects of the present invention will be better understood with regard to the detailed description of the embodiments below.

BRIEF DESCRIPTION OF THE DRAWINGS

FIGS. 2A-2D show a first embodiment of the present invention.

FIGS. 3A and 3B are characteristic diagrams showing breakdown voltages of isolated devices of the prior art and the present invention respectively.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1:
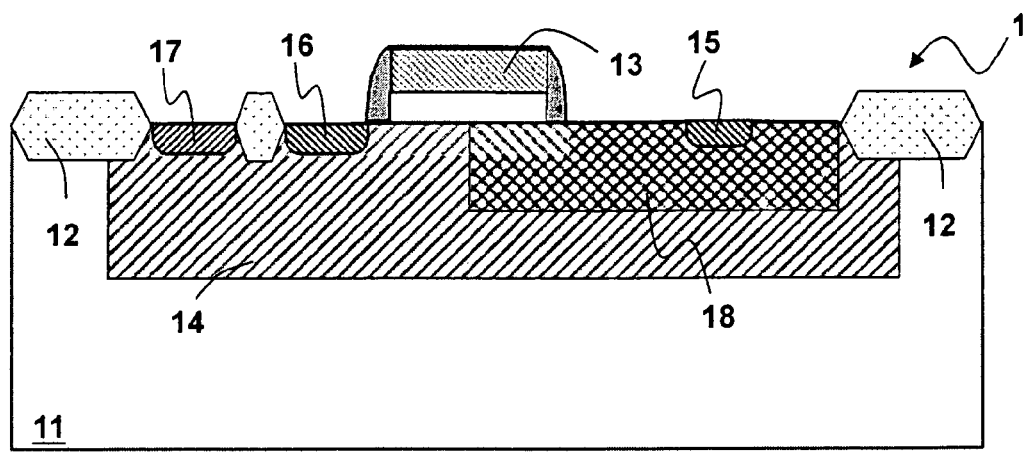
FIG. 1 shows a cross-section view of a prior art P-type isolated MOS device.
Figure 2A:
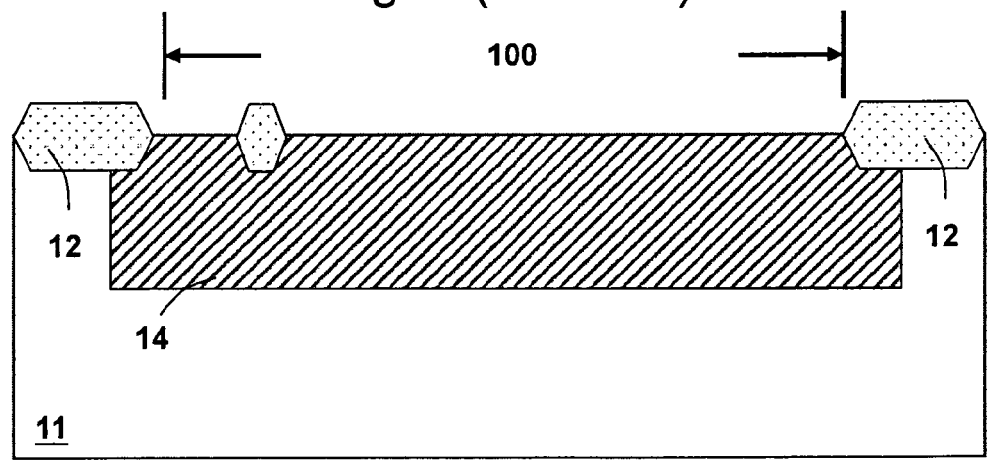
Figure 2B:
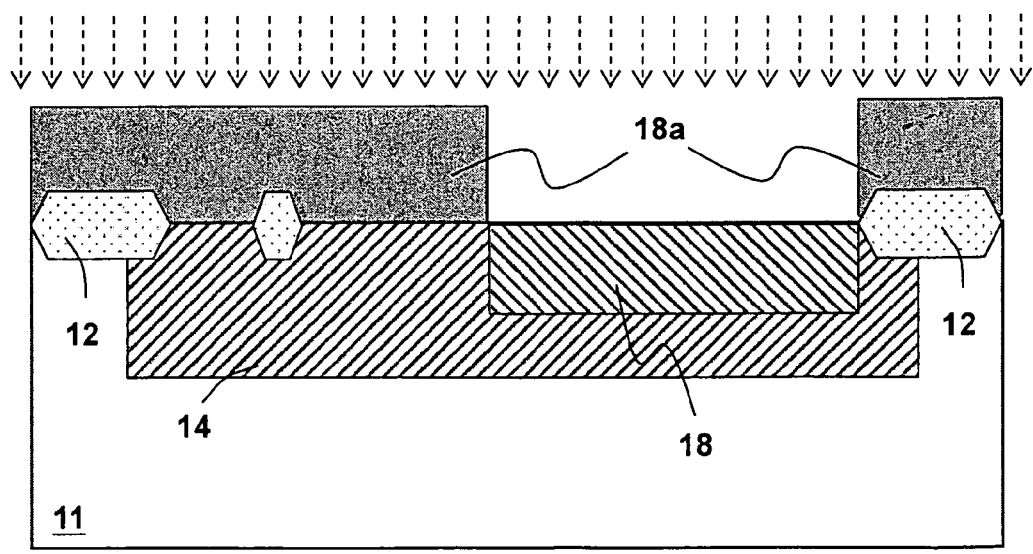

FIGS. 2A-2D show a first embodiment of the present invention. FIGS. 2A-2D are schematic cross-section diagrams showing a manufacturing flow of a P-type isolated MOS device 2 according to the present invention. As shown in FIG. 2A, the P-type substrate 11 has multiple isolation regions 12 by which a device region 100 is defined. The P-type substrate 11 may instead be a substrate of any kind, which has a P-type well 11. The isolation region 12 for example is a shallow trench isolation (STI) structure or a local oxidation of silicon (LOCOS) structure, the latter being shown in the figures. An N-type isolated well 14 is formed below the upper surface of the P-type substrate 11. The isolated well 14 is formed by a lithography process and an ion implantation process, which is also used in forming a high voltage device (not shown) in another area of the substrate 11. For saving the manufacturing cost, parameters of the ion implantation process of the isolated well 14 can be set according to the required breakdown voltage of the high voltage device. That is, because the same lithography process and ion implantation process are used in forming the isolated well 14 and the high voltage device, the manufacturing cost can be saved. As such, the impurity density of the isolated well 14 is lower than a typical isolated MOS device. As shown in FIG. 2B, a P-type drift-drain region 18 is formed in the isolated well 14 below the upper surface of the substrate 11. The P-type drift-drain region 18 is formed by a lithography process and an ion implantation process, wherein the lithography process defines the implantation regions by a photoresist mask 18a, and the ion implantation process implants P-type impurities to the defined regions in the form of accelerated ions (indicated by dashed arrow lines as shown in the figure). As shown in FIG. 2C, a mitigation region 19 is formed by the photoresist mask 18a and an ion implantation process, wherein the ion implantation process implants N-type impurities to the defined regions in the form of accelerated ions (indicated by dashed arrow lines as shown in the figure). Note that the mitigation region 19 has a shallowest portion located at least below 90% depth of the drift-drain region 18, as measured from the upper surface. The ion implantation processes which form the drift-drain region 18 and the mitigation region 19 are interchangeable in order; the drift-drain region 18 does not have to be formed first. In general, the mitigation region 19, which is deeper, may be formed first. Referring to FIG. 2D, a gate 13 is formed on the upper surface of the substrate 11, and a P-type drain 15, a P-type source 16, and an N-type well contact 17 are formed in the substrate 11. The gate 13 is in the isolated well 14 from top view (not shown). The source 16 and the drain 15 are located at both sides of the gate 13 respectively in the isolated well 14 below the upper surface of the substrate 11, wherein the drain 15 and the source 16 are separated by the gate 13. The gate 13 and the drain 15 are separated by the drift-drain region 18, and part of the drift-drain region 18 is located below the gate 13. The drain 15 is located in the drift-drain region 18.

Note that the mitigation region 19 and the drift-drain region 18 can be overlapped or not overlapped. "Overlapped" means that the shallowest part of the mitigation region 19 is located at or above 100% of a depth of the drift-drain region 18 as measured from the upper surface, and "not overlapped" means the shallowest part of the mitigation region 19 is located below 100% of the depth of the drift-drain region 18 as measured from the upper surface. FIG. 2D shows an embodiment wherein the mitigation region 19 and the drift-drain region 18 are overlapped, and the conductive type of the overlapped region is P-type with a lower density compared to the surrounding drift-drain region 18. In another embodiment wherein the drift-drain region is N-type, the conductive type of the overlapped region is N-type with a lower density compared to the surrounding drift-drain region.

FIGS. 3A and 3B respectively show characteristics of the breakdown voltages of the isolated devices of the prior art and the present invention, which illustrates how the present invention enhances the breakdown voltage of the isolated device. By comparing FIG. 3A which shows the breakdown voltage of the prior art isolated device and FIG. 3B which shows the breakdown voltage of the isolated device according to the present invention, it is clear that the breakdown voltage of the isolated device according to the present invention is obviously much higher than that of the prior art isolated device in the OFF condition.

FIG. 4 shows a second embodiment of the present invention. This embodiment is different from the first embodiment in that, the isolated device 3 of this embodiment further includes an N-type deep well 20, which is formed below the isolated well 14 in the substrate 11. This embodiment shows that, besides the drift-drain region 18 and the mitigation region 19 are formed by the same mask, and the mitigation region 19 has a shallowest portion located at least below 90% depth of the drift-drain region 18 as measured from the upper surface, there is no other limitation to the isolated device of the present invention and the present invention can be modified in various ways without impacting the function of the isolated device. For example, the mitigation region 19 may even connect to the deep well 20 or the P-type substrate 11.

Figure 4A:
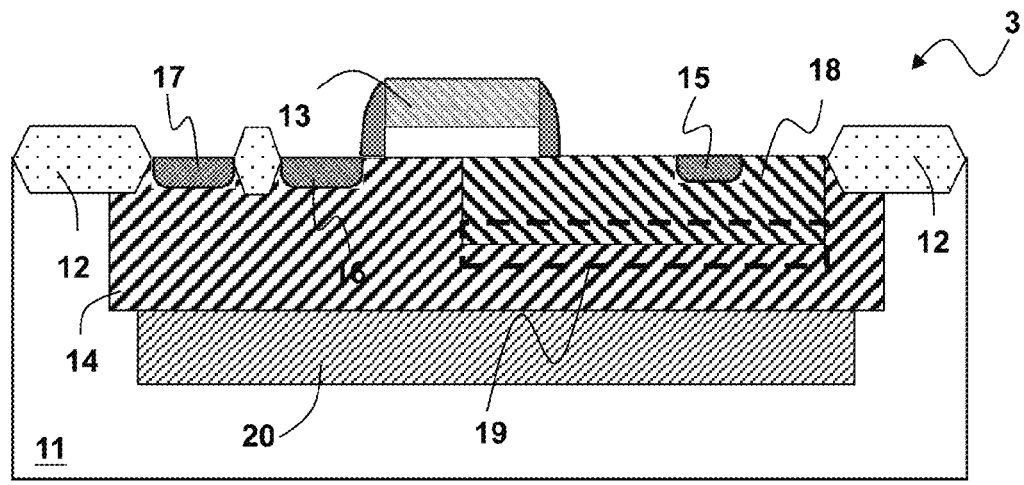
FIGS. 4A-4B show a second embodiment of the present invention.
Figure 4B:
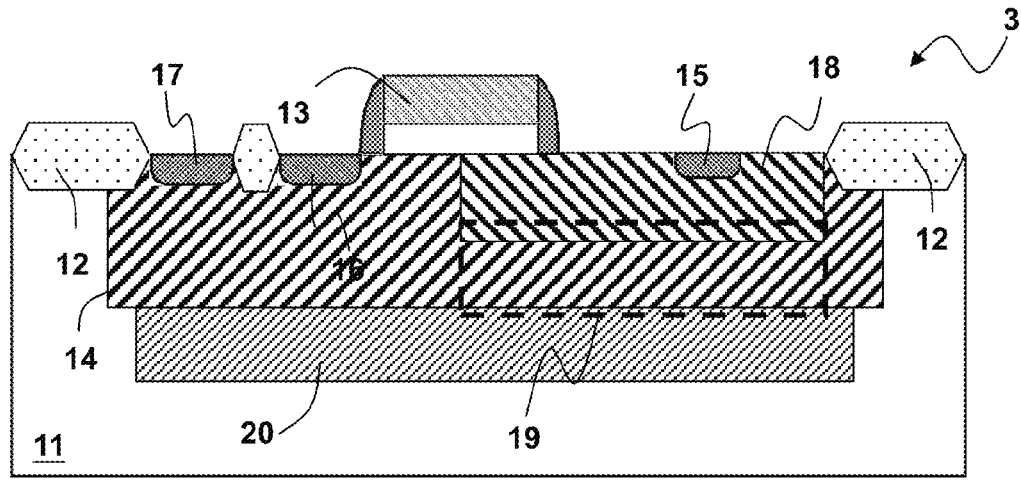
Figure 5:
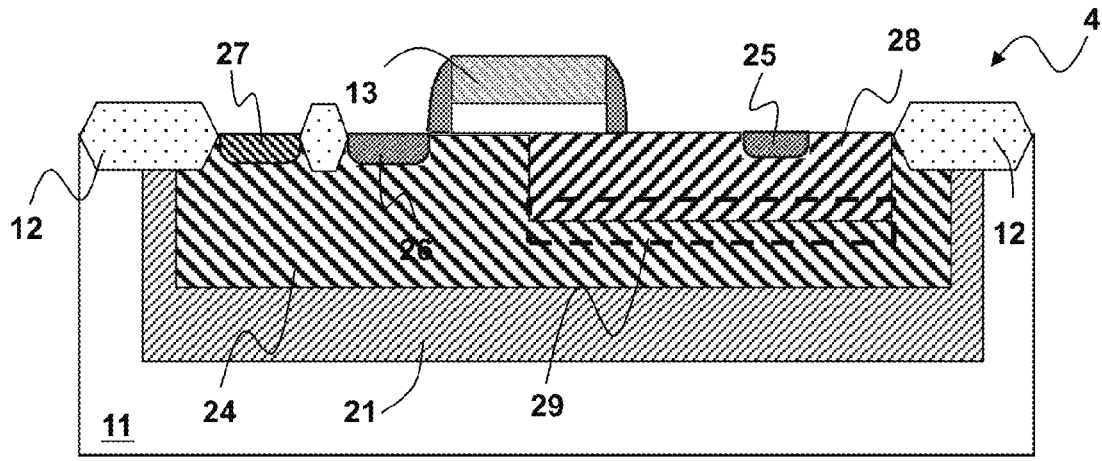
FIG. 5 shows a third embodiment of the present invention.

FIGS. 4A and 4B show cross-section diagrams of a second embodiment of the present invention. This embodiment is different from the first embodiment in that, the isolated device 3 of this embodiment further includes an N-type deep well 20, which is formed below the isolated well 14 in the substrate 11. This embodiment shows that, besides the drift-drain region 18 and the mitigation region 19 are formed by the same mask, and the mitigation region 19 has a shallowest portion located at least below 90% depth of the drift-drain region 18 as measured from the upper surface, there is no other limitation to the isolated device of the present invention and the present invention can be modified in various ways without impacting the function of the isolated device. For example, the mitigation region 19 may even connect to the deep well 20 or the P-type substrate 11 as shown in FIG. 4B.

Similar to the first embodiment, the mitigation region 29 and the drift-drain region 28 may be overlapped or not overlapped. In an embodiment wherein the mitigation region 29 and the drift-drain region 28 have an overlapped region, the conductive type of the overlapped region is N-type with a lower density compared to the surrounding drift-drain region 28.

Note that the P-type substrate 11 can be any type of substrate, for example may be a P-type bare substrate, i.e., a P-type silicon bare wafer, a P-type epitaxial silicon layer formed by an epitaxial process, etc.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristics of the device, such as a threshold voltage adjustment region, etc., can be added. For another example, the lithography step described in the above can be replaced by electron beam lithography, X-ray lithography, etc. In view of the foregoing, the spirit of the present invention should cover all such and other modifications and variations, which should be interpreted to fall within the scope of the following claims and their equivalents.

What is claimed is:

1. An isolated device formed in a P-type substrate having an upper surface, the isolated device comprising:
    an N-type isolated well formed below the upper surface in the P-type substrate;
    a gate formed on the upper surface, and in the isolated well from top view;
    a P-type source and a P-type drain, which are formed in the isolated well below the upper surface, and are located at both sides of the gate respectively and separated by the gate, wherein the drain is separated from and not connected with the gate;
    a P-type drift-drain region formed in the isolated well, the drift-drain region separating the gate and the drain, and part of the drift-drain region being beneath the gate, wherein the drain is located in the drift-drain region and the drift-drain region has a depth deeper than the drain; and
    an N-type mitigation region, which is formed in the substrate, and is located at a same region with the drift-drain region from top view, and has a shallowest portion located at least below 90% of a depth of the drift-drain region as measured from the upper surface of the substrate, and has a deepest portion connected to an N-type deep well below the isolated well or the substrate and the mitigation region and the drift-drain region are overlapped at a direction of the depth to form a P-type overlapped region;
    wherein the overlapped region has a lower P-type impurity density compared with the drift-drain region.

2. The isolated device of claim 1, wherein a high voltage device is formed in the substrate, and the isolated well is formed by a second lithography process and an ion implantation process which are used in forming the high voltage device.

3. A manufacturing method of an isolated device, comprising:
    forming an N-type isolated well in a P-type substrate, the substrate having an upper surface;
    forming a gate on the upper surface, the gate being in the isolated well from top view;
    forming a P-type source and a P-type drain in the isolated well below the upper surface, the source and the drain being located at both sides of the gate respectively and separated by the gate, wherein the drain is separated from and not connected with the gate;
    forming a P-type drift-drain region in the isolated well, the drift-drain region separating the gate and the drain, and part of the drift-drain region being beneath the gate, wherein the drain is located in the drift-drain region and the drift-drain region has a depth deeper than the drain; and
    forming an N-type mitigation region in the substrate, and is located at a same region with the drift-drain region from top view, and has a shallowest portion located at least below 90% of a depth of the drift-drain region as measured from the upper surface of the substrate, and has a deepest portion connected to an N-type deep well below the isolated well or the substrate and the mitigation region and the drift-drain region are overlapped at a direction of the depth to form a P-type overlapped region;
    wherein the overlapped region has a lower P-type impurity density compared with the drift-drain region.

4. The manufacturing method of claim 3, wherein a high voltage device is formed in the substrate, and the isolated well is formed by a second lithography process and an ion implantation process which are used in forming the high voltage device.

* * * * *